United States Patent
Jia et al.

(10) Patent No.: US 10,136,553 B2
(45) Date of Patent: Nov. 20, 2018

(54) HEAT DISSIPATION DEVICE AND ELECTRONIC DEVICE CONTAINING THE SAME

(71) Applicant: Lenovo (Beijing) Co., Ltd., Beijing (CN)

(72) Inventors: Zizhou Jia, Beijing (CN); Ying Sun, Beijing (CN); Zhigang Na, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 15/495,003

(22) Filed: Apr. 24, 2017

(65) Prior Publication Data

US 2017/0374763 A1    Dec. 28, 2017

(30) Foreign Application Priority Data

Jun. 23, 2016 (CN) .......................... 2016 1 0467012

(51) Int. Cl.
*H05K 7/20* (2006.01)

(52) U.S. Cl.
CPC ..... *H05K 7/20336* (2013.01); *H05K 7/20327* (2013.01)

(58) Field of Classification Search
CPC ............. H01L 23/473; H01L 21/68785; H01L 2924/3025; F28D 15/00; F28D 20/0034; H05K 7/20772; H05K 7/20336; H05K 7/20327; F25D 17/02

See application file for complete search history.

(56) References Cited

U.S. PATENT DOCUMENTS

| | | | | |
|---|---|---|---|---|
| 4,635,705 A * | 1/1987 | Kuznetsov | .......... | B22D 11/0611 164/429 |
| 5,198,752 A * | 3/1993 | Miyata | ............... | G01R 1/07314 165/80.4 |
| 7,601,189 B2 * | 10/2009 | Lampinen | ............... | A62B 11/00 165/61 |
| 8,830,660 B2 * | 9/2014 | Kuehl | ..................... | F25D 23/00 361/601 |
| 2007/0051496 A1 | 3/2007 | Hong et al. | | |
| 2008/0216986 A1 * | 9/2008 | Sweet | .................. | F24D 11/003 165/45 |
| 2013/0098317 A1 * | 4/2013 | Schatz | ...................... | F01P 3/00 123/41.44 |
| 2013/0118710 A1 * | 5/2013 | Chen | ...................... | F25D 31/00 165/104.11 |
| 2014/0202665 A1 * | 7/2014 | Paschkewitz | ........... | F28D 15/02 165/104.26 |

(Continued)

FOREIGN PATENT DOCUMENTS

| CN | 2884529 Y | 3/2007 |
|---|---|---|
| CN | 101146429 A | 3/2008 |
| CN | 101227810 A | 7/2008 |

(Continued)

*Primary Examiner* — James Wu
*Assistant Examiner* — Michael Matey
(74) *Attorney, Agent, or Firm* — Anove Law Group, PLLC (57) ABSTRACT

A heat dissipation device and an electronic device thereof are provided. The heat dissipation device includes a heat dissipation body including a closed chamber; and at least two pumps in the closed chamber to drive heat dissipation medium contained in the closed chamber to flow in one or more loops.

16 Claims, 3 Drawing Sheets

(56) References Cited

U.S. PATENT DOCUMENTS

2014/0293542 A1* 10/2014 Vetrovec ............... H01L 23/473
                                                                           361/699
2014/0352928 A1* 12/2014 Huang ............... H05K 7/20236
                                                                           165/104.31

FOREIGN PATENT DOCUMENTS

| CN | 102901220 A | 1/2013 |
| CN | 203231673 U | 10/2013 |

* cited by examiner

HEAT DISSIPATION DEVICE AND ELECTRONIC DEVICE CONTAINING THE SAME

CROSS-REFERENCES TO RELATED APPLICATIONS

This application claims the priority of Chinese patent application No. 201610467012.4, filed on Jun. 23, 2016, the entire content of which is incorporated herein by reference.

FIELD OF THE DISCLOSURE

The present disclosure relates to the field of heat dissipation technologies and, more particularly, relates to a heat dissipation device and an electronic device containing a heat dissipation device.

BACKGROUND

As electronic devices become smaller and smaller, heat dissipation devices in the electronic devices become smaller and smaller. Heat dissipation devices have become one of the bottlenecks that restrict performance of the electronic devices.

Conventional heat dissipation device in an electronic device may include a heat pipe. Pure water or hydrogen chloride may be contained in the heat pipe. The heat pipe has one end as an evaporation end and another end as a condensation end. When one end of the heat pipe is heated, the liquid in the capillary evaporates rapidly and the generated vapor flows to the other end under a pressure difference to release heat. The vapor then re-condenses into liquid. The liquid may then flow back to the evaporation side by the capillary force along the porous material. Such process may be repeated. The heat may be transferred from one end of the heat pipe to the other end and continuously transferred out.

However, in conventional beat dissipation device, the medium in the heat pipe is returned from the cooling section to the heating section mainly by gravity. To accommodate with the conventional heat dissipation device, the electronic device may be placed in an inappropriate position, which often leads to poor heat pipe cooling effect. In addition, the heat transfer by the liquid is easy to be saturated. Heat transfer capacity is greatly limited.

The disclosed heat dissipation device and the electronic device are directed to solve one or more problems set forth above and problems in the art.

BRIEF SUMMARY OF THE DISCLOSURE

One aspect of the present disclosure provides a device, including: a heat dissipation body including a closed chamber; and at least two pumps in the closed chamber to drive heat dissipation medium contained in the closed chamber to flow in one or more loops.

Another aspect of the present disclosure provides an electronic device, including a heat generator; and a heat dissipation device in a close proximity to the heat generator. The heat dissipation device includes a heat dissipation body including a closed chamber, and at least two pumps in the closed chamber to drive heat dissipation medium contained in the closed chamber to flow in one or more loops.

Other aspects of the present disclosure can be understood by those skilled in the art in light of the description, the claims, and the drawings of the present disclosure.

DETAILED DESCRIPTION

Reference will now be made in detail to examples of embodiments of the disclosure, which are illustrated in the accompanying drawings. Wherever possible, the same reference numbers will be used throughout the drawings to refer to the same or like parts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

The present disclosure provides a heat dissipation device and an electronic device containing a heat dissipation device.

Figure 1:
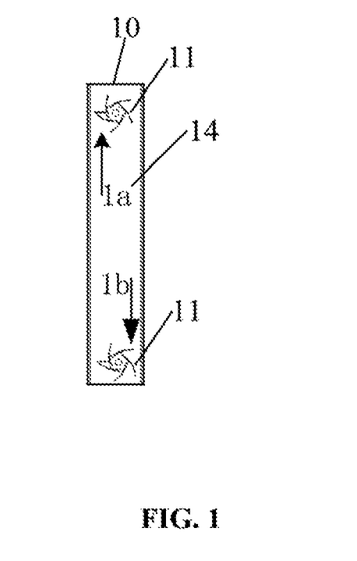
FIG. 1 illustrates an example of a heat dissipation device according to some embodiments of the present disclosure.

FIG. 1 is a schematic diagram of an example of a heat dissipation device according to various embodiments of the present disclosure. As shown in FIG. 1, the heat dissipation device of the present disclosure includes a heat dissipation body 10. A closed chamber 14 is formed in the heat dissipation body 10. Heat dissipation medium is contained in the closed chamber 14. The heat dissipation body 10 may be made of a metal or a thermally-conductive nonmetallic material.

As shown in FIG. 1, the heat dissipation body 10 of the heat dissipation device may have a tubular structure, e.g., having a shape of a circular tube or a square tube.

In some embodiments, the heat dissipation body 10 of the heat dissipation device may have a box structure, such as a square box structure or a cylindrical box structure.

The heat dissipation body 10 may be mounted to a heat generator including an electronic device. Due to a simple outer shape shown in FIG. 1, the heat dissipation body 10 can be more easily in contact with the heat generator with a large contact area. Heat dissipated from the heat generator can be better absorbed.

The shape of the heat dissipation body 10 may be determined based on the shape of the heat generator, provided that the contact area between the closed chamber 14 and the heat generator is sufficiently large for absorbing, via the closed chamber 14, the heat radiated from the heat generator.

In the present disclosure, at least two pumps 11 may be provided in the closed chamber 14 to respectively drive the heat dissipation medium to flow in a loop in the closed chamber 14. As shown in FIG. 1, the two pumps 11 are provided at both ends of the closed chamber 14. When the two pumps 11 are operated simultaneously, for example, rotating in a clockwise direction, the rotation of the pumps 11 may generate a force against the heat dissipation medium in the closed chamber 14 to allow the heat dissipation medium to flow in a loop in the closed chamber 14. When the pump 11 is rotated, a portion of the heat dissipation medium in the closed chamber 14 flows in the direction indicated by the arrow 1*a* in the closed chamber 14 in FIG. 1. On the opposite side of the closed chamber 14, the heat dissipation medium flows in the direction 1*b* opposite to the direction of the other side indicated by arrow 1*a*, causing the heat dissipation medium to flow in a loop and circulate within the closed chamber 14.

As such, by providing two pumps 11, the heat dissipation medium in the closed chamber 14 may flow faster to quickly absorb heat from the heat generator and to interact with rest of the heat dissipation medium and wall of the closed chamber 14 for a rapid heat exchange. The disclosed heat dissipation device provides better heat dissipation effect.

The heat dissipation medium is a fluid and the flow direction thereof may be complicated. The flow directions shown in the figures as disclosed herein may only for illustration purposes.

In various embodiments, the heat dissipation medium may be centered around one pump 11 to form an annular flow direction on one side, or on both sides. In the entire closed chamber 14, a plurality of annular flow directions may be formed. In one embodiment, the flow direction of the heat dissipation medium may include a portion shown in FIG. 1 to form convections in a left and right direction and/or a up and down direction within the closed chamber 14.

In other embodiments, the two pumps 11 may also be provided at locations other than the ends of the closed chamber 14. For example, one pump 11 may be provided at one end (e.g., either the upper end or the lower end of the device shown in FIG. 1) of the closed chamber 14, and the other pump 11 may be provided at a position between the two ends of the closed chamber 14, for example, in the middle of the closed chamber 14. Alternatively, the two pumps 11 may be substantially equally spaced within the closed chamber 14. For example, a distance between the two pumps 11 may equal to or substantially equal to a distance between a pump 11 and a respective, closest end of the closed chamber 14.

Of course, when the volume or space in the closed chamber 14 is sufficiently large, the two pumps 11 may both be provided at the middle (or other positions between the two ends) or the end of the closed chamber 14. For example, the two pumps 11 may be arranged along a direction of the paper face in FIG. 1, e.g., in a direction perpendicular to the length direction of the device shown in FIG. 1, with sufficient distance there-between to drive the heat dissipation medium within the closed chamber 14 to flow better. In some embodiments, more than two pumps may be included in the closed chamber 14 arranged at least according to the disclosed arrangements for the two pumps.

The heat dissipation device described in the present disclosure may be included in an electronic device, for example, may be in contact with or adjacent to the heat generating element or heat generator of the electronic device.

As such, by providing at least two pumps in a closed chamber of a heat dissipation device, the heat dissipation medium in the closed chamber may flow faster in the closed chamber to greatly enhance the efficiency of heat exchange. The heat dissipation efficiency of the heat dissipation medium can be greatly improved. When the heat dissipation device of the present disclosure is included in the electronic device, the electronic device may more efficiently dissipate the heat to ensure the processing efficiency of the electronic device and to improve data processing ability of the electronic device.

Figure 2:
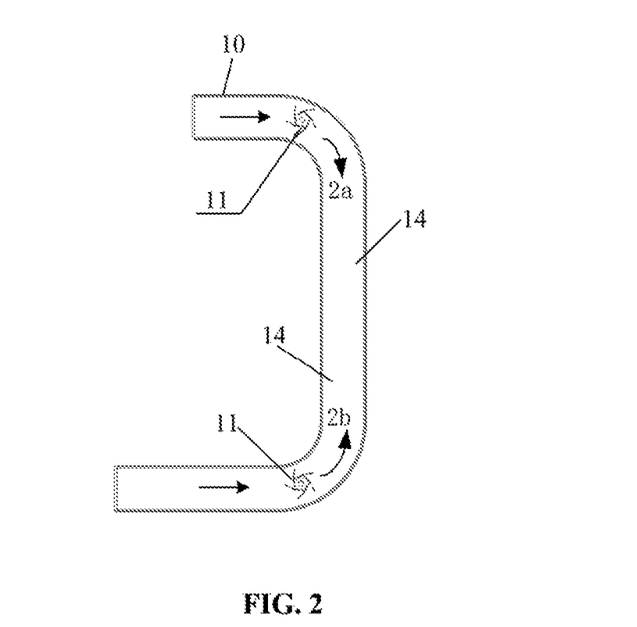
FIG. 2 illustrates another example of a heat dissipation device according to some embodiments of the present disclosure.

In another embodiment of the present disclosure, FIG. 2 illustrates a schematic diagram of another example of a heat dissipation device according to various embodiments of the present disclosure. As shown in FIG. 2, the heat dissipation device of the present disclosure includes a heat dissipation body 10. A closed chamber 14 is formed in the heat dissipation body 10. Heat dissipation medium is contained in the closed chamber 14.

As shown in FIG. 2, the heat dissipation body 10 of the heat dissipation device may have a tubular structure, e.g., having a shape of a circular tube or a square tube.

The heat dissipation body 10 may have a curved portion in proximity to each end of the heat dissipation body 10. The shape of the heat dissipation body 10 can be determined based on the shape of the heat generator, as long as the contact area between the closed chamber 14 and the heat generator is sufficient and the heat generated by the heat generator can be absorbed by the closed chamber 14.

In one embodiment, the closed chamber 14 is provided with two pumps 11 to respectively drive the heat dissipation medium to form a loop in the closed chamber 14. As shown in FIG. 2, the two pumps 11 may be provided in proximity to both ends of the closed chamber 14. The path lengths of the two loops between the two pumps 11 formed in the closed chamber 14 may be comparable with one another, so that the heat dissipation medium in the closed chamber 14 can be more thermally exchanged.

By providing two pumps 11 in the closed chamber 14, when the two pumps 11 are operated simultaneously, for example, rotating in a clockwise direction, the rotation of the pumps 11 may generate a force against the heat dissipation medium in the closed chamber 14 to allow the heat dissipation medium to flow in loop(s) in the closed chamber 14. When the pump 11 at the upper end of the closed chamber 14 shown in FIG. 2 is rotated, the heat dissipation medium in the closed chamber 14 flows in the direction indicated by the arrow 2*a* in the closed chamber 14 shown in FIG. 2. When the pump 11 at the lower end of the closed chamber 14 shown in FIG. 2 is rotated, the heat dissipation medium in the closed chamber 14 flows in the direction indicated by the arrow 2*b* in the closed chamber 14 shown in FIG. 2. The direction indicated by the arrow 2*a* at the upper end of the closed chamber 14 is opposite to the direction indicated by the arrow 2*b* at the lower end of the closed chamber 14, causing the heat dissipation medium to convect to form the corresponding loops.

In the present disclosure, by providing two drive pumps 11, the heat dissipation medium in the closed chamber 14 may flow faster to quickly absorb heat from the heat generator and to interact with the rest of the heat dissipation medium and wall of the closed chamber 14 for a rapid heat exchange, so that the disclosed heat dissipation device provides better heat dissipation effect.

The heat dissipation medium is a fluid and the flow direction thereof may be complicated. The flow directions shown in the figures may only for illustration purposes. The heat dissipation medium may be centered around one pump 11 to form an annular flow direction on one side, or on both sides. In the entire closed chamber 14, a plurality of annular flow directions may be formed. In one embodiment, the flow direction of the heat dissipation medium may include a portion shown in FIG. 2 to form convections in a left and right direction and/or a up and down direction of the heat dissipation device.

In other embodiments, the two pumps 11 may also be provided at locations other than in proximity to the ends of the closed chamber 14. For example, one pump 11 may be provided at the upper end of the closed chamber 14, and the other pump 11 may be provided in the middle (or any position between the two ends) of the closed chamber 14. Alternatively, one pump 11 may be provided at the lower end of the closed chamber 14, and the other pump 11 may be provided in the middle of the closed chamber 14. Alternatively, the two pumps 11 may be substantially equally spaced within the closed chamber 14. For example, a distance between the two pumps 11 may equal to or substantially equal to a distance between a pump 11 and a respective, closest end of the closed chamber 14. Of course, when the volume or space in the closed chamber 14 is sufficiently large, the two pumps 11 may both be provided at the middle or the end of the closed chamber 14. For example, the two pumps 11 may be arranged along a direction of the paper face in FIG. 2, to ensure a sufficient distance there-between to drive the heat dissipation medium within the closed chamber 14 to flow better. In some embodiments, more than two pumps may be included in the closed chamber 14 at least having the disclosed arrangements for the two pumps.

In one embodiment, the heat dissipation medium may include a liquid at room temperature (or a room-temperature liquid), containing liquid metal and/or liquid metal alloy. Accordingly, the heat dissipation medium of the present disclosure may include indium, gallium, or a mixture thereof. The liquid metal and/or liquid metal alloy may better absorb heat from the heat generator and further facilitate heat exchange between the heat dissipation medium.

In another embodiment, the disclosed heat dissipation medium may include water, alcohol, methanol, Freon, and other suitable liquid media.

The heat dissipation device described in the present disclosure may be applied to an electronic device, for example, may be in contact with or adjacent to the heat generating element or heat generator of the electronic device.

As such, by providing at least two pumps in a closed chamber of a heat dissipation device, the heat dissipation medium may flow faster in the closed chamber to greatly enhance the efficiency of heat exchange. The heat dissipation efficiency of the heat dissipation medium can be greatly improved. When the heat dissipation device of the present disclosure is applied for the electronic device, the electronic device may more efficiently dissipate the heat to ensure the processing efficiency of the electronic device and to improve data processing ability of the electronic device.

Figure 3:
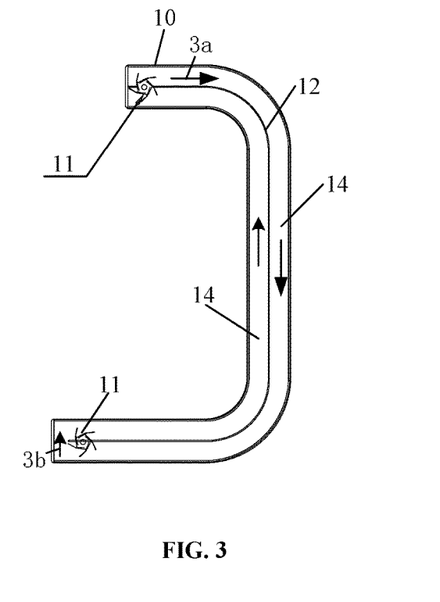
FIG. 3 illustrates another example of a heat dissipation device according to some embodiments of the present disclosure.

In another embodiment of the present disclosure, FIG. 3 is a schematic diagram of another example of a heat dissipation device according to various embodiments of the present disclosure. As shown in FIG. 3, the heat dissipation device of the present disclosure includes a heat dissipation body 10, two pumps 11 configured in the heat dissipation body 10, and a power source (not illustrated) disposed outside the heat dissipation body 10 to provide driving power to the pumps 11. The power source drives the pumps 11 to operate and to exert a force on the heat dissipation medium to cause the heat dissipation medium to flow in the closed chamber 14 and thus form one or more loops.

In one embodiment, the closed chamber 14 is provided with two pumps 11 to respectively drive the heat dissipation medium to form a loop in the closed chamber 14. As shown in FIG. 3, the two pumps 11 may be provided in proximity to both ends of the closed chamber 14. The path lengths of the two loops between the two pumps 11 formed in the closed chamber 14 may be comparable with one another, so that the heat dissipation medium in the closed chamber 14 can be more thermally exchanged.

The pump 11 may be an electromagnetic pump, and the power source may be an electromagnetic power source. The power source may provide a variable magnetic field for the pump 11 to enable operation of the pump 11, e.g., by controlling an electromagnetic circuit. The pump 11 may then be operated. Such a power source may be provided in non-contact manner with the pump 11. For example, the power source may be provided by a suitable distance from the pump 11.

In some embodiments, the power source includes an electromagnetic coil. By providing a time-varying current to the electromagnetic coil, the electromagnetic coil may form a transformed electromagnetic field. The transformed electromagnetic field may be applied on the pumps 11 in the closed chamber 14. When the electromagnetic field is changing, the pump 11 may be subjected to a corresponding force, which drives the rotor of the pump 11 to rotate. In this manner, a varying electromagnetic field is generated by the electromagnet, and the rotor of the pump 11 may be driven to rotate and to thus realize separation of the driving part and the rotating part of the pump.

For example, the electromagnetic field may include three sets of coils each capable of generating an electromagnetic field. Each set of coils is provided on two sides of the center line of the driving part corresponding to a rotation center of the rotating portion. Each set of coils is capable of generating an electromagnetic field that attracts the rotor of the pump 11. As such, use of the coil to periodically change the electromagnetic field may promote the rotation of the rotor of the pump 11. Of course, any suitable configurations of the coils, the pump, etc. may be used and included within the scope of the present disclosure.

By changing direction of the supply current of the electromagnet, the rotation direction of the rotor of the pump 11 may be controlled, for example, in a clockwise rotation direction or in a counterclockwise rotation direction.

In one embodiment, the heat dissipation medium may include a liquid at room temperature, containing liquid metal and/or liquid metal alloy. Accordingly, the heat dissipation medium of the present disclosure may include indium, gallium, or a mixture thereof. The liquid metal and/or liquid metal alloy may better absorb heat from the heat generator and further facilitate heat exchange between the heat dissipation medium.

In another embodiment, the disclosed heat dissipation medium may include water, alcohol, methanol, Freon, and other suitable liquid media.

As shown in FIG. 3, to form desired circulation loop(s) of the heat dissipation medium in the closed chamber 14, a spacer 12 may be provided in the closed chamber 14. As shown in FIG. 3, completely different liquid loops may be formed in the closed chamber 14. When the two pumps 11 are simultaneously rotated, the heat dissipation medium in the closed chamber 14 may flow in the direction indicated by the arrows 3a/3b in the closed chamber 14 shown in FIG. 3. For example, the heat dissipation medium may be circulated in the closed chamber 14 in a clockwise direction as shown in FIG. 3. Because a spacing is configured between one end of the spacer 12 and the inner wall of the spacer chamber 14, the heat dissipation medium is capable of forming a circulating flow in the clockwise direction in the closed chamber 14. At the upper end of the closed chamber 14, the pump 11 may be mounted on the spacer 12, e.g., the other end of the spacer 12. The spacer 12 may have a hole structure at the upper end to allow the heat dissipation medium to pass through and to form a circulation loop in the closed chamber 14. In various embodiments, the spacer 12 may include a partition structure, or the like.

The heat dissipation device described in the present disclosure may be applied to an electronic device, for example, may be in contact with or adjacent to the heat generating element or heat generator of the electronic device.

In some embodiments, the heat dissipation body 10 of the heat dissipation device may have a tubular structure, e.g., having a shape of a circular tube or a square tube. In other embodiments, the heat dissipation body 10 of the heat dissipation device may have a box structure, such as a square box structure or a cylindrical box structure. In still other embodiments, the heat dissipation body 10 of the heat dissipation device may be U-shaped, as shown in FIG. 3.

The heat dissipation body 10 may have any suitable shape(s) without limitation. For example, the heat dissipation body 10 of the heat dissipation device may have a shape compatible with or set according to a shape of the heat generator in the electronic device, e.g., to allow a contact area between the heat dissipation body 10 and heat generator as large as possible to better absorb the heat emitted by the heat generator.

When the pumps 11 are rotated in a clockwise direction, the heat dissipation medium forms a loop in the closed chamber 14 in a clockwise manner. When the pumps 11 are rotated in a counterclockwise direction, the heat dissipation medium forms a loop in the closed chamber 14 in a counterclockwise manner.

As such, by providing at least two pumps in a closed chamber of a heat dissipation device, the heat dissipation medium may flow faster in the closed chamber to greatly enhance the efficiency of heat exchange. The heat dissipation efficiency of the heat dissipation medium can be greatly improved. When the heat dissipation device of the present disclosure is applied for the electronic device, the electronic device may more efficiently dissipate the heat to ensure the processing efficiency of the electronic device and to improve data processing ability of the electronic device.

Figure 4:
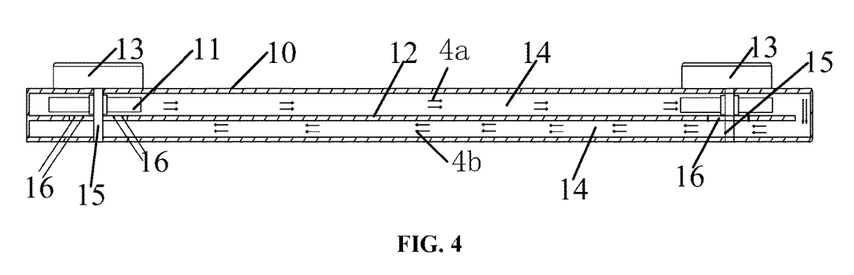
FIG. 4 illustrates another example of a heat dissipation device according to some embodiments of the present disclosure.

In another embodiment of the present disclosure, FIG. 4 is a schematic diagram of another example of a heat dissipation device according to various embodiments of the present disclosure. As shown in FIG. 4, the heat dissipation device of the present disclosure includes a heat dissipation body 10, two pumps 11 configured in the heat dissipation body 10, and power sources 13 disposed outside the heat dissipation body 10 to provide driving power to the pumps 11. The power source drives the pump 11 to operate and to exert a force on the heat dissipation medium to cause the heat dissipation medium to flow in the closed chamber 14 and thus form a loop.

In one embodiment, the closed chamber 14 is provided with two pumps 11 to respectively drive the heat dissipation medium to form loop(s) in the closed chamber 14. As shown in FIG. 4, the two pumps 11 may be provided in proximity to ends of the closed chamber 14. The path lengths of the two loops between the two pumps 11 formed in the closed chamber 14 may be comparable with one another, so that the heat dissipation medium in the closed chamber 14 can be more thermally exchanged.

As shown in FIG. 4, a shaft 15 may be provided at each end of the closed chamber 14 to fix the pump 11 on the shaft 15. The power source 13 is a power supply for supplying power to the pump 11. The power source 13 is electrically connected to the pump 11 to provide power for each pump 11. The rotor of the pump 11 then rotates to drive the heat dissipation medium in the closed chamber 14. The power source 13 passes through the wall of the closed chamber 14 to provide the pump 11 with operating power. For example, a small hole may be provided through the wall of the closed chamber 14 for passing through the electric wires of the power source 13. After the electric wire passes through the wall of the closed chamber 14, the provided small hole in the closed chamber 14 is sealed.

As shown in FIG. 4, to form desired circulation loop(s) of the heat dissipation medium in the closed chamber 14, a spacer 12 may be provided in the closed chamber 14. Completely different liquid loops may be formed in the closed chamber 14. When the pumps 11 are rotated, the heat dissipation medium in the closed chamber 14 may flow in the direction indicated by the arrows 4a/4b in the closed chamber 14 shown in FIG. 4. For example, the heat dissipation medium may be circulated in the closed chamber 14 in a clockwise direction. Because a spacing is configured between one end of the spacer 12 and the inner wall of the spacer chamber 14, the heat dissipation medium is capable of forming a circulating flow in the clockwise direction in the closed chamber 14.

In addition, at the left and right ends of the closed chamber 14 of FIG. 4, pumps 11 may be mounted on the spacer 12. The spacer 12 may have a hole structure 16 on the other end, corresponding to one of the pumps to allow the heat dissipation medium to pass through and to form a circulation loop in the closed chamber 14. In various embodiments, the spacer 12 may include a partition structure, or the like.

In one embodiment, the heat dissipation medium may include a liquid at room temperature, containing liquid metal and/or liquid metal alloy. Accordingly, the heat dissipation medium of the present disclosure may include indium, gallium, or a mixture thereof. The liquid metal and/or liquid metal alloy may better absorb heat from the heat generator and further facilitate heat exchange between the heat dissipation medium.

In another embodiment, the disclosed heat dissipation medium may include water, alcohol, methanol, Freon, and other suitable liquid media.

The heat dissipation device described in the present disclosure may be applied to an electronic device, for example, may be in contact with or adjacent to the heat generating element or heat generator of the electronic device.

In some embodiments, the heat dissipation body 10 of the heat dissipation device may have a tubular structure, e.g., having a shape of a circular tube or a square tube. In other embodiments, the heat dissipation body 10 of the heat dissipation device may have a box structure, such as a square box structure or a cylindrical box structure.

The heat dissipation body 10 may have any suitable shape(s) without limitation. For example, the heat dissipation body 10 of the beat dissipation device may have a shape compatible with or set according to a shape of the heat generator in the electronic device, e.g., to allow a contact area between the heat dissipation body 10 and heat generator as large as possible to better absorb the heat emitted by the heat generator.

When two pumps 11 are both rotated in a clockwise direction, the heat dissipation medium forms a loop in the closed chamber 14 in a clockwise manner. When two pumps 11 are both rotated in a counterclockwise direction, the heat dissipation medium forms a loop in the closed chamber 14 in a counterclockwise manner. Of course, one of the pumps 11 may be rotated in the clockwise direction, and the other of the pumps 11 may be rotated in a counterclockwise direction.

As such, by providing at least two pumps in a closed chamber of a heat dissipation device, the heat dissipation medium may flow faster in the closed chamber to greatly enhance the efficiency of heat exchange. The heat dissipation efficiency of the heat dissipation medium can be greatly improved. When the heat dissipation device of the present disclosure is applied for the electronic device, the electronic device may more efficiently dissipate the heat to ensure the processing efficiency of the electronic device and to improve data processing ability of the electronic device.

Figure 5:
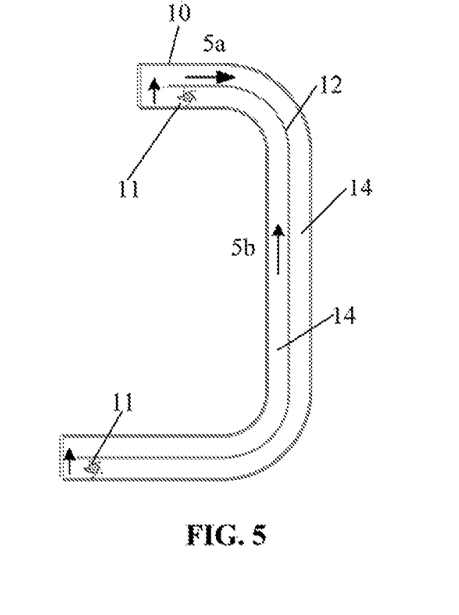
FIG. 5 illustrates another example of a heat dissipation device according to some embodiments of the present disclosure.

In another embodiment of the present disclosure, FIG. 5 is a schematic diagram of another example of a heat dissipation device according to various embodiments of the present disclosure. As shown in FIG. 5, the heat dissipation device of the present disclosure includes a heat dissipation body 10, two pumps 11 configured in the heat dissipation body 10, and power sources (not illustrated) disposed outside the heat dissipation body 10 to provide driving power to the pumps 11. The power source drives the pump 11 to operate and to exert a force on the heat dissipation medium to cause the heat dissipation medium to flow in the closed chamber 14 and thus form loop(s).

In one embodiment, the closed chamber 14 is provided with two pumps 11 to respectively drive the heat dissipation medium to form loop(s) in the closed chamber 14. As shown in FIG. 5, the two pumps 11 may be provided in proximity to both ends of the closed chamber 14. The path lengths of the two loops between the two pumps 11 formed in the closed chamber 14 may be comparable with one another, so that the heat dissipation medium in the closed chamber 14 can be more thermally exchanged.

The pump 11 may be an electromagnetic pump, and the power source may be an electromagnetic power source. The power source may provide a varying magnetic field for the pump 11 to enable operation of the pump 11, e.g., by controlling an electromagnetic circuit. The pump 11 may then be operated. Such a power source may be provided in non-contact manner with the pump 11. For example, the power source may be provided at a suitable distance from the pump 11.

In some embodiments, the power source includes an electromagnetic coil. By providing a time-varying current to the electromagnetic coil, the electromagnetic coil may form a transformed electromagnetic field. The transformed electromagnetic field may be applied on the pumps 11 in the closed chamber 14. When the electromagnetic field is changing, the pump 11 may be subjected to a corresponding force, which drives the rotor of the pump 11 to rotate. In this manner, a varying electromagnetic field is generated by the electromagnet, so that the rotor of the pump 11 may be driven to rotate and to thus realize separation of the driving part and the rotating part.

For example, the electromagnetic field may include three sets of coils each capable of generating an electromagnetic field. Each set of coils is provided on two sides of the center line of the driving part corresponding to a rotation center of the rotating portion. Each set of coils is capable of generating an electromagnetic field that attracts the rotor of the pump 11. As such, use of the coil to periodically change the electromagnetic field may promote the rotation of the rotor of the pump 11. Of course, any suitable configurations may be used and included within the scope of the present disclosure.

By changing direction of the supply current of the electromagnet, the rotation direction of the rotor of the pump 11 may be controlled, for example, in a clockwise rotation direction or in a counterclockwise rotation direction.

The power source may also be a power supply that is directly connected to the pump 11 to allow the pump 11 to be rotated in clockwise or counterclockwise directions by providing the pump 11 with a positive or negative voltage.

The heat dissipation device of the present disclosure includes a heat dissipation body 10. A closed chamber 14 is formed in the heat dissipation body 10. Heat dissipation medium is contained in the closed chamber 14.

In one embodiment, the heat dissipation medium may include a liquid at room temperature, containing liquid metal and/or liquid metal alloy. Accordingly, the heat dissipation medium of the present disclosure may include indium, gallium, or a mixture thereof. The liquid metal and/or liquid metal alloy may better absorb heat from the heat generator and further facilitate heat exchange between the heat dissipation medium.

In another embodiment, the disclosed heat dissipation medium may include water, alcohol, methanol, Freon, and other suitable liquid media.

As shown in FIG. 5, to form desired circulation loop(s) of the heat dissipation medium in the closed chamber 14, a spacer 12 may be provided in the closed chamber 14, such that completely different liquid loops may be formed in the closed chamber 14. When the two pumps 11 are simultaneously rotated, the heat dissipation medium in the closed chamber 14 may flow in the direction indicated by the arrows 5a/5b in the closed chamber 14 shown in FIG. 5. For example, the heat dissipation medium may be circulated in the closed chamber 14 in a clockwise direction as shown in FIG. 5. Because a spacing is configured between the lower end portion of the spacer 12 and the inner wall of the spacer chamber 14, the heat dissipation medium is capable of forming a circulating flow in the clockwise direction in the closed chamber 14.

To better flow the heat dissipation medium in the closed chamber 14, two pumps 11 are provided on different sides of the spacer 12 in the closed chamber 14 using the spacer 12 as the center line. In other words, the closed chamber 14 may be divided by the spacer 12 into two a first chamber and a second chamber separated by the spacer 12. One pump 11 may be provided in one of the first and second chambers, and the other pump 11 may be provided in the other of the first and second chambers. In this manner, the heat dissipation medium in each of the first and second chambers may flow better, ensuring that the heat dissipation medium in the closed chamber 14 flows faster and thus the heat dissipation effect of the present disclosure is more efficient.

At the upper end of the closed chamber 14, pump 11 may be mounted on the spacer 12. The spacer 12 may have a hole structure at the upper end to allow the heat dissipation medium to form a circulation loop in the closed chamber 14. In various embodiments, the spacer 12 may include a partition structure, or the like.

The heat dissipation device described in the present disclosure may be applied to an electronic device, for example, may be in contact with or adjacent to the heat generating element or heat generator of the electronic device.

In some embodiments, the heat dissipation body 10 of the heat dissipation device may have a tubular structure, e.g., having a shape of a circular tube or a square tube. In other embodiments, the heat dissipation body 10 of the heat dissipation device may have a box structure, such as a square box structure or a cylindrical box structure. In still other embodiments, the heat dissipation body 10 of the heat dissipation device may be U-shaped, as shown in FIG. 5.

The heat dissipation body 10 may have any suitable shape(s) without limitation. For example, the heat dissipation body 10 of the heat dissipation device may have a shape compatible with or set according to a shape of the heat generator in the electronic device, e.g., to allow a contact area between the heat dissipation body 10 and heat generator as large as possible to better absorb the heat emitted by the heat generator.

When the pump 11 is rotated in a clockwise direction, the heat dissipation medium forms a loop in the closed chamber 14 in a clockwise manner. When the pump 11 is rotated in a counterclockwise direction, the heat dissipation medium forms a loop in the closed chamber 14 in a counterclockwise manner.

As such, by providing at least two pumps in a closed chamber of a heat dissipation device, the heat dissipation medium may flow faster in the closed chamber to greatly enhance the efficiency of heat exchange. The heat dissipation efficiency of the heat dissipation medium can be greatly improved. When the heat dissipation device of the present disclosure is applied for the electronic device, the electronic device may more efficiently dissipate the heat to ensure the processing efficiency of the electronic device and to improve data processing ability of the electronic device.

Figure 6:
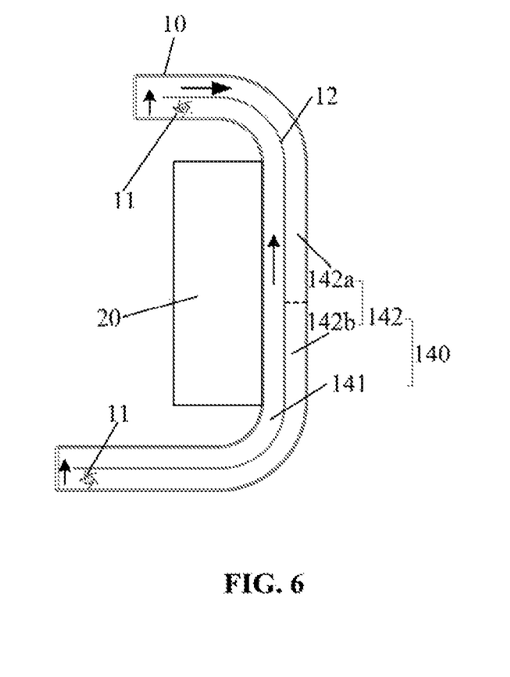
FIG. 6 illustrates another example of a heat dissipation device according to some embodiments of the present disclosure.

In another embodiment, FIG. 6 is a schematic diagram of another example of a heat dissipation device according to various embodiments of the present disclosure. As shown in FIG. 6, the heat dissipation device of the present disclosure includes a heat dissipation body 10, two pumps 11 configured in the heat dissipation body 10, and a power source (not illustrated) disposed outside the heat dissipation body 10 to provide driving power to the pumps 11. The power source drives the pumps 11 to operate and to exert a force on the heat dissipation medium to cause the heat dissipation medium to flow in the closed chamber 14 and thus form a loop.

In one embodiment, the closed chamber 14 is provided with two pumps 11 to respectively drive the heat dissipation medium to form a loop in the closed chamber 14. As shown in FIG. 2, the two pumps 11 may be provided at both ends of the closed chamber 14. The path lengths of the two loops between the two pumps 11 formed in the closed chamber 14 may be comparable with one another, so that the heat dissipation medium in the closed chamber 14 can be more thermally exchanged.

The pump 11 may be an electromagnetic pump, and the power source may be an electromagnetic power source. The power source may provide a variable magnetic field for the pump 11 to enable operation of the pump 11, by controlling an electromagnetic circuit. The pump 11 may then operates. Such a power source may be provided in non-contact manner with the pump 11. For example, the power source may be provided at a suitable distance from the pump 11.

In some embodiments, the power source includes an electromagnetic coil. By providing a time-varying current to the electromagnetic coil, the electromagnetic coil may form a transformed electromagnetic field. The transformed electromagnetic field may be applied on the pumps 11 in the closed chamber 14. When the electromagnetic field is changing, the pump 11 may be subjected to a corresponding force, which drives the rotor of the pump 11 to rotate. In this manner, a varying electromagnetic field is generated by the electromagnet, so that the rotor of the pump 11 may be driven to rotate and to thus realize separation of the driving part and the rotating part.

For example, the electromagnetic field may include three sets of coils each capable of generating an electromagnetic field. Each set of coils is provided on two sides of the center line of the driving part corresponding to a rotation center of the rotating portion. Each set of coils is capable of generating an electromagnetic field that attracts the rotor of the pump 11. As such, use of the coil to periodically change the electromagnetic field may promote the rotation of the rotor of the pump 11. Of course, any suitable configurations of the coil and the pump may be used and included within the scope of the present disclosure.

By changing direction of the supply current of the electromagnet, the rotation direction of the rotor of the pump 11 may be controlled, for example, in a clockwise rotation direction or in a counterclockwise rotation direction.

The power source may also be a power supply that is directly connected to the pump 11 to allow the pump 11 to be rotated in clockwise or counterclockwise directions by providing the pump 11 with a positive or negative voltage.

The heat dissipation device of the present disclosure includes a heat dissipation body 10. A closed chamber 14 is formed in the heat dissipation body 10. Heat dissipation medium is contained in the closed chamber 14.

In one embodiment, the heat dissipation medium may include a liquid at room temperature, containing liquid metal and/or liquid metal alloy. Accordingly, the heat dissipation medium of the present disclosure may include indium, gallium, or a mixture thereof. The liquid metal and/or liquid metal alloy may better absorb heat from the heat generator and further facilitate heat exchange between the heat dissipation medium.

In another embodiment, the disclosed heat dissipation medium may include water, alcohol, methanol, Freon, and other suitable liquid media.

As shown in FIG. 5, to form desired circulation loop(s) of the heat dissipation medium in the closed chamber 14, a spacer 12 may be provided in the closed chamber 14, such that completely different liquid loops may be formed in the closed chamber 14. When the two pumps 11 are simultaneously rotated, the heat dissipation medium in the closed chamber 14 may flow in the direction indicated by the arrows 5a/5b in the closed chamber 14 shown in FIG. 5. For example, the heat dissipation medium may be circulated in the closed chamber 14 in a clockwise direction as shown in FIG. 5. Because a spacing is configured between each end of the spacer 12 and the inner wall of the spacer chamber 14, the heat dissipation medium is capable of forming a circulating flow in the clockwise direction in the closed chamber 14.

To make the heat dissipation medium flow better in the closed chamber 14, two pumps 11 are provided on different sides of the spacer 12 in the closed chamber 14 using the spacer 12 as the center line. In other words, the closed chamber 14 may be divided by the spacer 12 into a first chamber and a second chamber separated by the spacer 12. One pump 11 may be provided in one of the first and second chambers, and the other pump 11 may be provided in the other of the first and second chambers. In various embodiments, the spacer 12 may include a partition structure, or the like.

In this manner, the heat dissipation medium in each of the first and second chambers may flow better, ensuring that the heat dissipation medium in the closed chamber 14 flows faster and thus the heat dissipation effect of the present disclosure is more efficient.

In another embodiment of the present disclosure, as shown in FIG. 6, the heat dissipation chamber 140 is divided into two chambers including a first chamber 141 and a second chamber 142 spaced by a spacer 12. As shown, the first chamber 141 is an inner-chamber of the U-shape of the closed chamber, while the second chamber 142 is an outer-chamber. The first chamber 141 is in close contact with a heat generator 20. The heat dissipation medium in the first chamber 141 absorbs the heat from the heat generator 20 and diffuses the heat into the second chamber 142 of the closed chamber 140.

The second chamber 142 further includes sub-chamber 142a and sub-chamber 142b as shown in FIG. 6. The heat dissipation medium flows through the end regions of the closed chamber 140 and flows back into the first chamber 141 to form a circulation loop. The first chamber 141 provides a first region corresponding to a portion of closed chamber that is close to or attached to the heat generator 20. The sub-chamber 142a corresponds to a second region of the closed chamber 140 and the sub-chamber 142b corresponds to a third region of the closed chamber 140. When the two pumps 11 are rotated both in clockwise, the heat dissipation medium in the first chamber 141 absorbs the heat dissipation from the heat generator 20, and the heat dissipation medium in the first chamber 141 is diffused into the sub-chamber 142a of the closed chamber 140. The heat dissipation medium of the sub-chamber 142b of the closed chamber 140 flows through one end of the closed chamber 140 and is returned to the sub-chamber 142a to form a loop.

The heat dissipation device described in the present disclosure may be applied to an electronic device, for example, may be in contact with or adjacent to the heat generating element or heat generator of the electronic device.

In some embodiments, the heat dissipation body 10 of the heat dissipation device may have a tubular structure, e.g., having a shape of a circular tube or a square tube. In other embodiments, the heat dissipation body 10 of the heat dissipation device may have a box structure, such as a square box structure or a cylindrical box structure. In still other embodiments, the heat dissipation body 10 of the heat dissipation device may be U-shaped, as shown in FIG. 6.

The heat dissipation body 10 may have any suitable shape(s) without limitation. For example, the heat dissipation body 10 of the heat dissipation device may have a shape compatible with or set according to a shape of the heat generator in the electronic device, e.g., to allow a contact area between the heat dissipation body 10 and heat generator as large as possible to better absorb the heat emitted by the heat generator.

When the pumps 11 are rotated in a clockwise direction, the heat dissipation medium forms a loop in the closed chamber 14 in a clockwise manner. When the pumps 11 are rotated in a counterclockwise direction, the heat dissipation medium forms a loop in the closed chamber 14 in a counterclockwise manner.

As such, by providing at least two pumps in a closed chamber of a heat dissipation device, the heat dissipation medium may flow faster in the closed chamber to greatly enhance the efficiency of heat exchange. The heat dissipation efficiency of the heat dissipation medium can be greatly improved. When the heat dissipation device of the present disclosure is applied for the electronic device, the electronic device may more efficiently dissipate the heat to ensure the processing efficiency of the electronic device and to improve data processing ability of the electronic device.

In another embodiment of present disclosure, an electronic device is provided. The electronic device is configured with the disclosed heat dissipation device.

For example, the heat dissipation device in the present disclosure may be mounted onto the heat generator of the electronic device. The heat generator may include a processor such as a CPU, a video card, a power supply, etc. For components that require heat dissipation, the disclosed heat dissipation device can be directly attached to the heat generator. By configuring the pumps in the closed chamber using the driving source configured on the heat dissipation device, the pumps can rotate in the closed chamber to drive the heat dissipation medium to flow in the closed chamber.

The heat dissipation medium may absorb heat from the heat generator. When the heat dissipation medium flows to areas of the closed chamber which are in non-contact with the heat generator, the heat dissipation medium may dissipate the absorbed heat out. As such, heat exchange may be formed and heat dissipation of the heat generator may be achieved.

The electronic device described herein may include a notebook, a mobile phone, a tablet computer, a personal digital assistant, a desktop computer, a television set, etc. According to the present disclosure, at least two pumps can be provided in the closed chamber of the heat dissipation device to allow the heat dissipation medium to flow through the closed chamber to form loop(s). This greatly enhances the heat dissipation efficiency of the heat dissipation medium, thereby making the electronic device more efficient when the heat dissipation device of the present disclosure is included in the electronic device. Processing efficiency of the electronic device may be improved and data processing capabilities of the electronic device may also be improved.

It should be appreciated by those skilled in this art that the embodiments of this disclosure may be provided in the form of a method, device, system or computer program product.

In the present disclosure, relational terms such as first and second, and the like, may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Various embodiments of the present specification are described in a progressive manner, in which each embodiment focusing on aspects different from other embodiments, and the same and similar parts of each embodiment may be referred to each other. Since the disclosed electronic device corresponds to the disclosed information processing method, the description of the disclosed electronic device is relatively simple, and the correlation may be referred to the method section.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A device, comprising:
a heat dissipation body comprising a closed chamber;
at least two pumps in the closed chamber to drive heat dissipation medium contained in the closed chamber to flow in one or more loops;
a spacer in the closed chamber to divide the closed chamber into a first chamber and a second chamber;
a shaft to fix the pump on the spacer; and
power sources on an outer surface of the closed chamber and each over one of the pumps in the closed chamber,
wherein:
a spacing is between at least one end of the spacer and a wall of the closed chamber, and
the pumps are on end portions of the spacer and on a same side of the spacer.

2. The device according to claim 1, wherein:
the at least two pumps include two pumps in proximity to ends of the closed chamber.

3. The device according to claim 1, wherein:
the closed chamber comprises one or more of a circular tube, a square tube, a cylindrical box structure, and a square box structure.

4. The device according to claim 1, wherein:
one pump is in the first chamber, and
another pump is in the second chamber, such that the heat dissipation medium flows in a loop in the close chamber.

5. The device according to claim 1, wherein:
each pump is between an end of the spacer and the wall of the closed chamber.

6. The device according to claim 1, wherein:
the heat dissipation body comprises a first area in a close proximity to a heat generator, such that the heat dissipation medium around the first area of the heat dissipation body absorbs heat from the heat generator and diffuses the heat.

7. The device according to claim 1, wherein:
each of the pumps comprises an electromagnetic pump, and
each of the power sources is an electromagnetic power source.

8. The device according to claim 1, wherein:
the heat dissipation body is made of a metal or a thermally-conductive nonmetallic material.

9. The device according to claim 1, wherein:
the heat dissipation medium comprises a room-temperature liquid comprising one or more of a liquid metal and a liquid metal alloy.

10. The device according to claim 9, wherein:
the heat dissipation medium comprises one or more of indium and gallium.

11. The device according to claim 1, wherein:
the heat dissipation medium comprises one or more of water, ethanol, methanol, and Freon.

12. An electronic device, comprising:
a heat generator; and
a heat dissipation device in a close proximity to the heat generator,
the heat dissipation device comprising:
a heat dissipation body comprising a closed chamber,
at least two pumps in the closed chamber to drive heat dissipation medium contained in the closed chamber to flow in one or more loops,
a spacer in the closed chamber to divide the closed chamber into a first chamber and a second chamber,
a shaft to fix the pump on the spacer, and
power sources on an outer surface of the closed chamber and each over one of the pumps in the closed chamber,
wherein:
a spacing is between at least one end of the spacer and a wall of the closed chamber, and
the pumps are on end portions of the spacer on a same side of the spacer.

13. The device according to claim 12, wherein:
the heat generator of the electronic device comprises one or more of a processor, a video card, and a power supply.

14. The device according to claim 12, wherein:
one pump is in the first chamber, and
another pump is in the second chamber, such that the heat dissipation medium flows in a loop in the close chamber.

15. The device according to claim 12, wherein:
each pump is between an end of the spacer and a closest end of the closed chamber.

16. The device according to claim 12, wherein:
each of the pumps comprises an electromagnetic pump, and
each of the power sources is an electromagnetic power source.

* * * * *